(12) United States Patent
Lee et al.

(10) Patent No.: US 11,630,128 B2
(45) Date of Patent: Apr. 18, 2023

(54) PROBE PIN

(71) Applicant: GENED CO., LTD., Cheonan-si (KR)

(72) Inventors: Byung Sung Lee, Pyeongtaek-si (KR); Young Jin Choi, Cheongju-si (KR)

(73) Assignee: GENED CO., LTD., Cheonan-si (KR)

( * ) Notice: Subject to any disclaimer, the term of this patent is extended or adjusted under 35 U.S.C. 154(b) by 0 days.

(21) Appl. No.: 16/769,173

(22) PCT Filed: Dec. 24, 2019

(86) PCT No.: PCT/KR2019/018354
§ 371 (c)(1),
(2) Date: Jun. 2, 2020

(87) PCT Pub. No.: WO2021/125413
PCT Pub. Date: Jun. 24, 2021

(65) Prior Publication Data
US 2022/0317156 A1    Oct. 6, 2022

(30) Foreign Application Priority Data
Dec. 17, 2019   (KR) .................. 10-2019-0168542

(51) Int. Cl.
*G01R 1/073*   (2006.01)
*G01R 1/067*   (2006.01)

(52) U.S. Cl.
CPC ..... *G01R 1/07307* (2013.01); *G01R 1/06722* (2013.01); *G01R 1/06738* (2013.01)

(58) Field of Classification Search
CPC ............ G01R 1/06722; G01R 1/07307; G01R 1/06733; G01R 1/06738
See application file for complete search history.

(56) References Cited

U.S. PATENT DOCUMENTS

| | | | | |
|---|---|---|---|---|
| 4,417,206 A | * | 11/1983 | Stowers | G01R 1/06738 324/755.11 |
| 4,560,223 A | * | 12/1985 | Cooney | G01R 1/06722 439/387 |
| 6,462,567 B1 | * | 10/2002 | Vinther | G01R 1/06722 324/755.05 |
| 2007/0084903 A1 | * | 4/2007 | Leon | G01R 1/06738 228/51 |

(Continued)

FOREIGN PATENT DOCUMENTS

KR   10-20180111215 A   10/2018
KR   101957929 B1   3/2019

*Primary Examiner* — Paresh Patel
(74) *Attorney, Agent, or Firm* — United One Law Group LLC; Kongsik Kim; Jhongwoo Peck

(57) ABSTRACT

A probe pin is proposed. The probe pin includes a first plunger configured to come in contact with a testing target contact point of a testing object and a second plunger configured to come in contact with a testing contact point of a testing circuit, in which the first plunge or the second plunger has a stem extending with a predetermined cross-sectional area and a contact portion extending from the stem such that a cross-sectional area decreases, and having first second tips, which are configured to come in contact with the testing target contact point or the testing contact point, at a front end; and the first and second tips are formed in symmetric shapes at positions that are symmetric with a central axis of the stem therebetween.

4 Claims, 6 Drawing Sheets

(56) References Cited

U.S. PATENT DOCUMENTS

| | | | | |
|---|---|---|---|---|
| 2009/0261851 A1* | 10/2009 | Zhou | .................. | H01R 13/2492 |
| | | | | 324/755.05 |
| 2012/0122355 A1* | 5/2012 | Hemmi | .............. | G01R 1/06738 |
| | | | | 439/816 |
| 2013/0099811 A1* | 4/2013 | Lee | ........................ | G01R 1/067 |
| | | | | 324/754.11 |
| 2013/0271172 A1* | 10/2013 | Armendariz | ....... | G01R 1/06738 |
| | | | | 324/755.01 |
| 2015/0123687 A1* | 5/2015 | Lee | ..................... | G01R 1/0416 |
| | | | | 324/754.11 |
| 2018/0238932 A1* | 8/2018 | Hironaka | ................ | G01R 1/067 |
| 2018/0340976 A1* | 11/2018 | Ishii | .................. | G01R 1/06722 |

\* cited by examiner

I-I

PROBE PIN

CROSS REFERENCE TO RELATED APPLICATION

The present application is a U.S. national phase application of International Application PCT/KR2019/018354, filed Dec. 24, 2019 and designating the United States, which claims priority to Korean Patent Application No. 10-2019-0168542, filed Dec. 17, 2019, the entire contents of which application are incorporated herein for all purposes by this reference.

BACKGROUND OF THE INVENTION

Field of the Invention

The present invention relates to a probe pin and, more particularly, to a probe pin that is used for testing electrical characteristics of semiconductor devices.

Description of the Related Art

In general, smooth electrical connection is required between a semiconductor device and a tester to test the electrical characteristics of the semiconductor device.

A testing device for connection between a semiconductor device and a tester is classified into a socket board, a probe card, a connector, etc. The socket board is used when a semiconductor device is a semiconductor package type, the probe card is used when a semiconductor device is a semiconductor chip type, and the connector is used as a testing device that connects a semiconductor device and a tester in some discrete devices.

The functions of the testing devices such as the socket board, the probe card, and the connector are to connect a terminal of a semiconductor device and a tester to each other to enable bidirectional exchange of electrical signals.

A contact member that is used in a testing device as an important part of the testing device is a probe pin.

Such a probe pin includes an upper plunger configured to come in contact with a terminal of a semiconductor chip, a lower plunger disposed opposite the upper plunger to come in contact with a pad of a testing pad, and an elastic member disposed between the upper plunger and the lower plunger and providing elasticity by compression to at least one of the upper plunger and the lower plunger in testing.

The contact portions of ends, that is, the tips of the upper and lower plungers are worn through a large number of tests and the lifespan may be decreased by such wear. Further, the surface areas of the tips are increased by wear due to repeated tests, so a foreign substance, for example, tin is easily accumulated. Accordingly, contact resistance due to a large transfer amount of Sn is increased, which causes deterioration of reliability in testing.

SUMMARY OF THE INVENTION

The present invention has been made in an effort to solve the problems and an objective of the present invention is to provide a probe pin that can reduce accumulation of foreign substances and improve contact stability at the front end of a contact portion, which is configured to come in contact with a testing target contact point of a testing object and a testing contact point of a testing circuit.

In order to achieve the objectives, a probe pin of the present invention includes a first plunger configured to come in contact with a testing target contact point of a testing object and a second plunger configured to come in contact with a testing contact point of a testing circuit, in which the first plunge or the second plunger has: a stem extending with a predetermined cross-sectional area; and a contact portion extending from the stem such that a cross-sectional area decreases, and having first second tips, which are configured to come in contact with the testing target contact point or the testing contact point, at a front end, and the first and second tips are formed in symmetric shapes at positions that are symmetric with a central axis of the stem therebetween.

Accordingly, it is possible to increase reliability in testing by minimizing contact resistance when a testing object is tested through the probe pin.

The contact portion may have a first to fourth inclined surfaces inclined from each of the first and second tips such that the first and second tips form apexes of square-base pyramids and a pair of the first inclined surfaces is formed to face each other with the central axis therebetween to extend to a boundary line perpendicular to the central axis from the first and second tips; a pair of the second inclined surfaces is formed in contact with a circular circumferential surface of the contact portion at an opposite side of the first inclined surfaces with the first and second tips therebetween; and pairs of third and fourth inclined surfaces are each symmetrically formed at both sides with the first and second tips therebetween to come in contact with the first and second inclined surfaces, respectively.

Accordingly, when testing is performed with the plungers in contact with contact points, deformation by wear is reduced and contamination by dust, etc. is minimized, whereby it is possible to prevent an increase of electrical resistance and increase reliability in testing.

Further, the first to fourth inclined surfaces may have the same inclined angle.

Accordingly, the degrees of wear of the tips of the contact portion of the plunger are uniform and the electrical characteristics in contact are uniform, whereby it is possible to increase reliability in testing.

Further, a gap between the first and second tips may be larger than a radius of the stem and smaller than a diameter of the stem.

Accordingly, the gap between the tips is appropriately maintained, whereby it is possible to minimize electrical interference between the tips and increase contact reliability.

Further, the boundary line of the first inclined surfaces may be positioned between a lowermost point (P1) of the second inclined surface and lowermost points (P2) of the third and fourth inclined surface and may be defined close to the lowermost points (P2).

Accordingly, the inclined surfaces around a plurality of tips of the contact portion of the plunger may have the same angle.

Further, the first and second tips may be disposed with a gap therebetween corresponding to a diameter of the stem, and the contact portion may have a pair of inclined surfaces inclined from the first and second tips and symmetrically facing each other with the central axis therebetween.

Accordingly, it is possible to space a pair of tips as far as possible and minimize resistance by contact.

Further, inclined angles of the inclined surfaces may be acute angles.

Accordingly, contamination of the tips of the contact portion is minimized, whereby it is possible to increase reliability in testing, increase the cleaning cycle, and reduce the maintenance cost.

According to the present invention, the probe pin has a plurality of tips at the front end of a contact portion configured to come in contact with a testing object and the tips are in contact with inclined surfaces having acute angle or surfaces perpendicular to the inclined surfaces, thereby being able to minimize contact resistance due to electrical contact and contamination.

Accordingly, it is possible to reduce wear due to contact between the tips and a testing object and decrease electrical resistance by suppressing accumulation of foreign substances such as dust in contact, thereby being able to increase reliability in testing.

Further, it is possible to increase the cycle for cleaning the tips by suppressing contamination of the tips of the contact portion of the plunger, so it is possible to reduce maintenance cost and increase productivity of the product.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
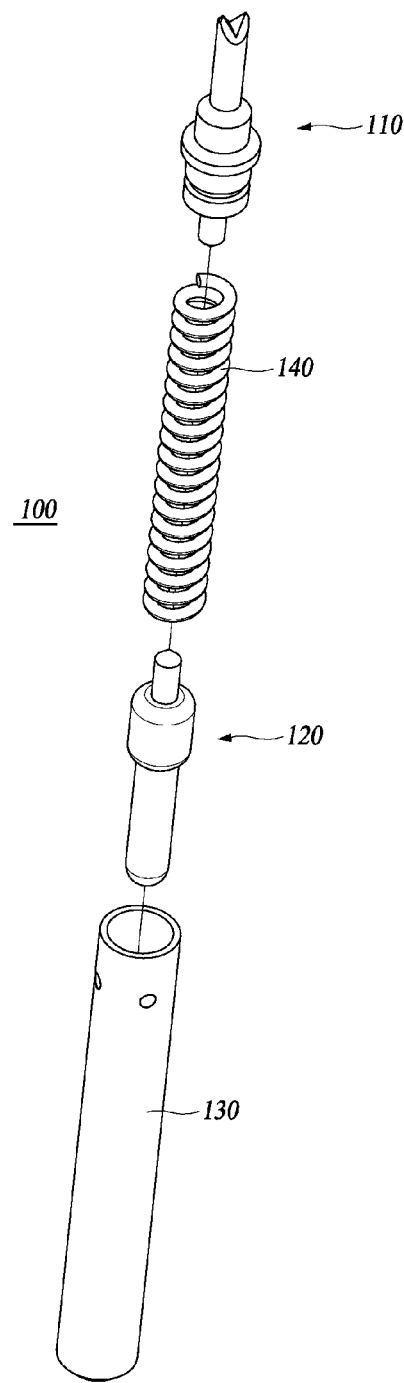
FIG. 1 is an exploded perspective view showing a probe pin according to an embodiment of the present invention.
Figure 2:
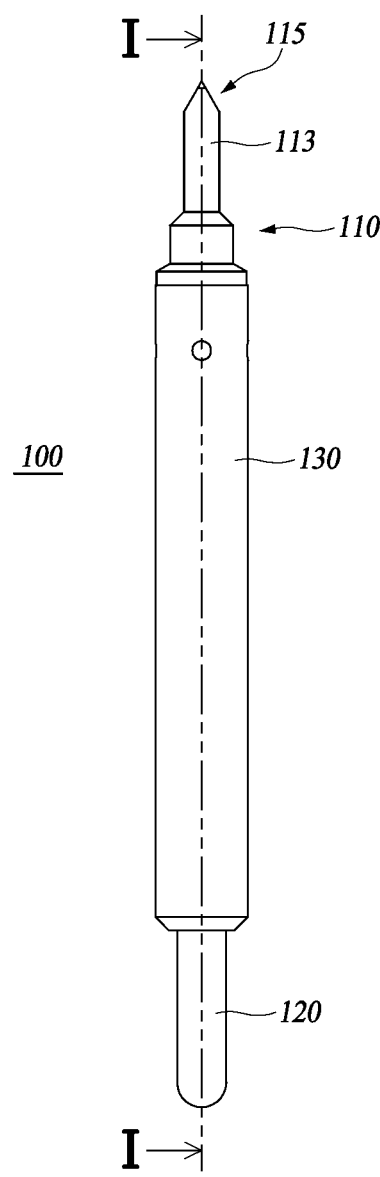
FIG. 2 is a front view of the probe pin shown in FIG. 1.
Figure 3:
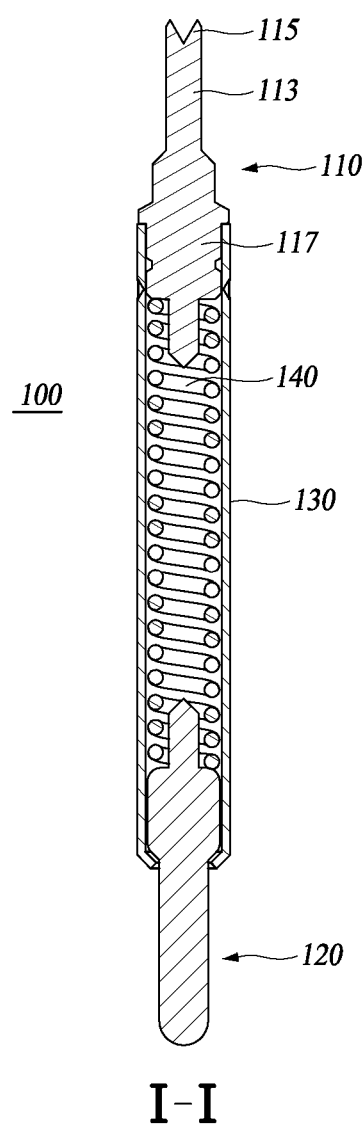
FIG. 3 is a cross-sectional view taken along the line I-I of FIG. 2.
Figure 4:
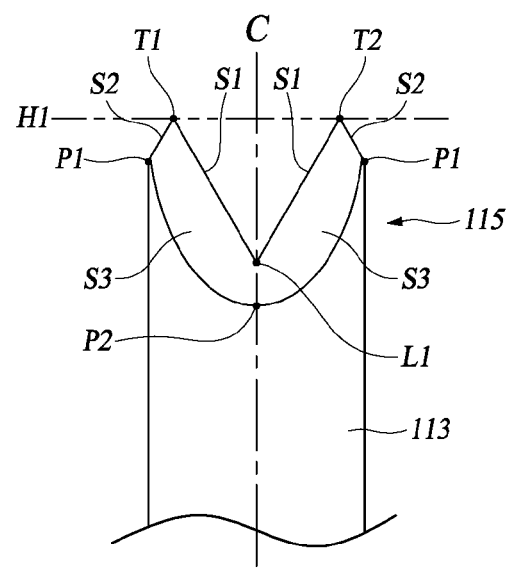
FIG. 4 is a front view showing main parts of a first plunger shown in FIG. 1.
Figure 5:
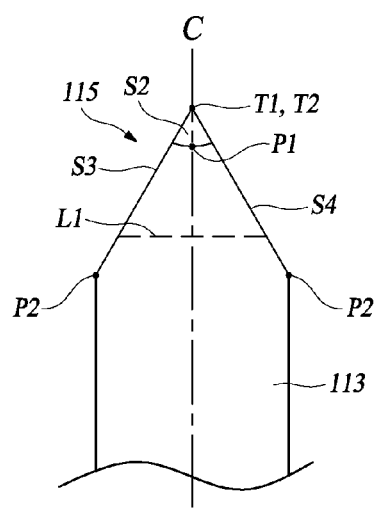
FIG. 5 is a side view showing the main parts of the first plunger shown in FIG. 4.
Figure 6:
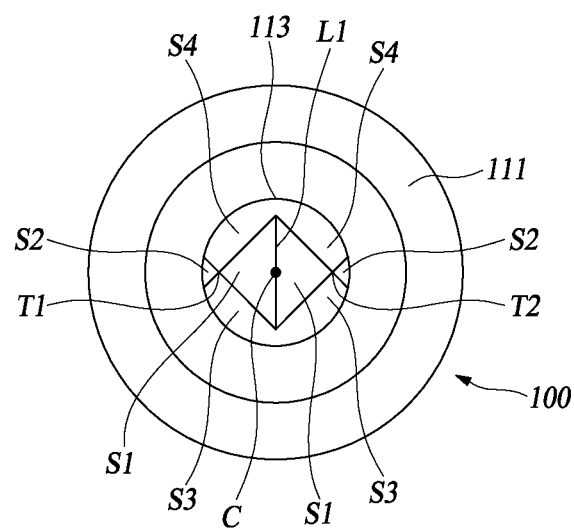
FIG. 6 is a plan view of the first plunger shown in FIG. 1.

Hereinafter, a probe pin according to an embodiment of the present invention will be described in detail with reference to accompanying drawings.

Referring to FIGS. 1 to 6, a probe pin 100 according to an embodiment of the present invention includes a first plunger 110, a second plunger 120, a pipe-shaped housing 130, and a spring 140.

The spring 140 is disposed in the housing 130 and can be compressed and expanded therein. The second plunge 120 is fitted in the lower portion of the housing 130 and the lower end of the second plunger 120 protrudes out of the housing 130. The first plunger 110 is fitted and fixed in the upper end of the housing 130.

According to this configuration, in testing, the first plunger 110 comes in contact with a testing target contact point of a testing object, that is, a semiconductor device, the lower end of the second plunger 120 comes in contact with a testing contact point of a testing circuit, and the spring 130 is compressed and the second plunger 120 can be moved up and down by contact pressure. Obviously, the first plunger 110 may be installed to be able to move up and down in the housing 130 and the second plunger 120 may be fixed to the housing 130. It is exemplified in the following description of an embodiment of the present invention that the first plunger 110 is a so-called upper plunger that is fixed to the upper portion of the housing 130.

In more detail, the first plunger 110 is coupled to an end of the housing 130. The first plunger 110 has a coupling portion 111 of which an end, that is, the lower end is fitted in the housing 130, a stem 113 having a cylindrical shape and formed over the coupling portion 111, and a contact portion 115 extending from the stem 113 such that the cross-sectional area decreases.

The contact portion 115 has a first tip T1 and a second tip T2 at the front end, and the first tip T1 and the second tip T2 are spaced apart from each other at the same height. The gap between the first and second tips T1 and T2 is smaller than the diameter of the stem 113 and larger than the radius of the stem 113. The first and second tips T1 and T2 are formed symmetrically with a central axis C of the stem 113 therebetween.

Four, that is, first to fourth inclined surfaces S1, S2, S3, and S4 are connected to each of the first and second tips T1 and T2 such that the first and second tips T1 and T2 each correspond to the apex of a square-based pyramid. First inclined surfaces S1 respectively connected to the first and second tips T1 and T2 are formed in a pair to face each other and are symmetrically formed in contact with a boundary line L1 perpendicular to the central axis C. The first inclined surface S1 is in contact with the third and fourth inclined surfaces S3 and S4 with a boundary therebetween.

The second inclined surface S2 is inclined on the opposite side to be symmetric to the first inclined surface S1 in each of the first and second tips T1 and T2. Accordingly, the second inclined surface S2 has the same inclined angle as the first inclined surface S1 and is in contact with a circular circumferential surface extending from the stem 133.

The third and fourth inclined surfaces S3 and S4 are respectively symmetrically formed at both sides with the first and second tips T1 and T2 therebetween, and have the same inclined angles. The second inclined surfaces S3 respectively connected to the first and second tips T1 and T2 are positioned and connected to each other in the same plane and the fourth inclined surfaces S4 respectively connected to the first and second tips T1 and T2 are also positioned and connected to each other in the same plane.

The first to fourth inclined surfaces S1, S2, S3, and S4 may have the same inclined angle, and preferably, may have an inclined angle between 25° and 35°.

Accordingly, the boundary line L1 of the first inclined surfaces S1 facing each other is defined lower than the lowermost points P1 of the second inclined surfaces S1 and higher than the lowermost points P2 of the third and fourth inclined surfaces S3 and S4. Further, the boundary line L1 is positioned close to the lowermost points P2, so the first and second tips T1 and T2 are positioned closer to the outer circumferential surface than the central axis C.

As described above, since the probe pin 100 has the first and second tips T1 and T2 at the front end of the contact portion 115 of the first plunger 110 such that two contact points spaced apart from each other are generated when the probe pin comes in contact with a testing object for testing, electrical connection can be stably generated.

In particular, since the first and second tips T1 and T2 are spaced apart from each other larger than the radius of the stem 113, it is possible to minimize influence and contact resistance between the tips when the tips are electrically connected to a testing object. Further, since the first to fourth inclined surfaces S1, S2, S3, and S4 are formed such that the first and second tips T1 and T2 respectively correspond to the apexes of square-based pyramids and the inclined angles are acute angles of 35° or less, even if the first and second tips T1 and T2 are worn due to long-time use in tests, an increase of the electrical contact area is minimized, whereby contact resistance can be reduced and an increase of resistance due to accumulation of dust, etc. can be minimized.

Figure 7:
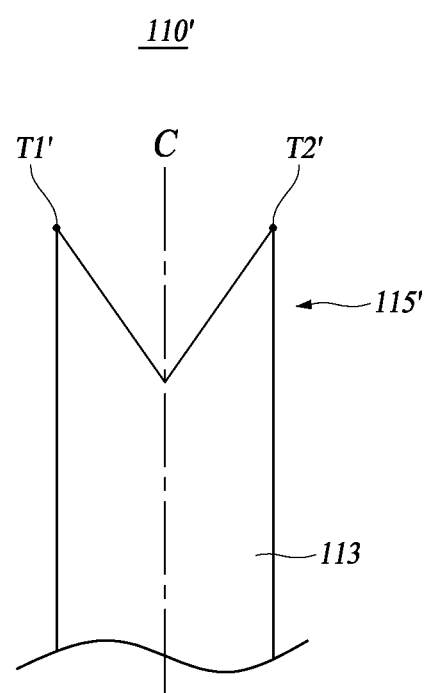
FIG. 7 is a front view showing main parts of a first plunger according to another embodiment of the present invention.
Figure 8:
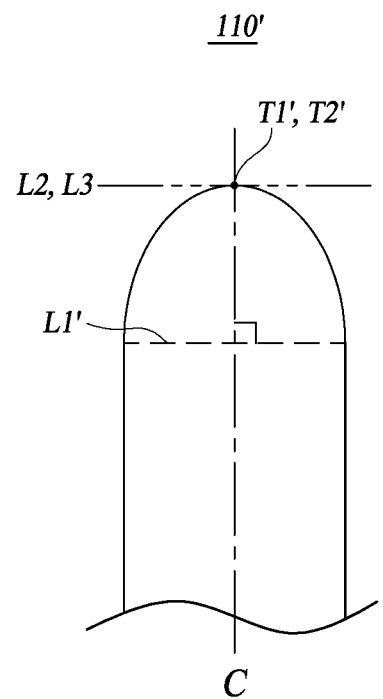
FIG. 8 is a side view of the first plunger shown in FIG. 7.
Figure 9:
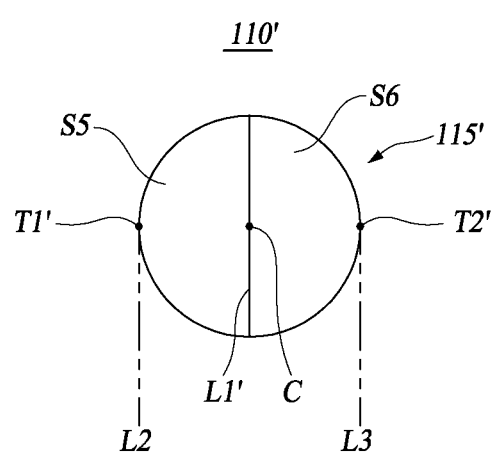
FIG. 9 is a plan view of the first plunger shown in FIG. 7.

Referring to FIGS. 7 to 9, a first plunger 110' according to another embodiment has a contact portion 115' at the upper portion of a stem 113 and the contact portion 115' has first and second tips T1' and T2' spaced apart from each other at the same height.

The first and second tips T1' and T2' are disposed with a gap therebetween that corresponds to the diameter of the stem 113 and are in contact with the outer circumference of the stem 113. The first and second tips T1' and T2' are symmetrically formed with respect to the central axis C of the stem 113 to be in contact with first and second inclined surfaces S5 and S6 facing each other. A boundary line L1' that the inclined surfaces S5 and S6 are in contact with may be perpendicular to the central axis C. Accordingly, the first and second tips T1' and T2' may be formed at symmetric positions with the central axis C therebetween, and the first and second inclined surfaces S5 and S6 may also be formed symmetrically with the same inclined angle. Accordingly, the first and second tips T1' and T2' are positioned at the tangential point of tangential lines L2 and L3 that are in contact with the outer circumference of the uppermost end of the contact portion 115' in parallel with the boundary line L'. The inclined angles of the inclined surfaces S5 and S6 may be acute angles, and preferably, may be 25° to 35°.

As described above, since the first and second tips T1' and T2' are disposed with a gap corresponding to the diameter of the stem 113 and are positioned on the boundary between the inclined surfaces having an acute angle and the outer circumferential surfaces, the probe pin can stably come in contact with a testing object on a plurality of points in testing.

Further, when contact occurs on two points, the contact area is decreased, so electrical resistance can be reduced. Further, accumulation of foreign substances such as dust is minimized, thereby being able to increase reliability in testing.

The present invention was described in connection with exemplary embodiments for exemplifying the principle of the present invention, but the present invention is not limited to the configuration and operation shown in the figures and described herein. It would be understood well by those skilled in the art that the present invention can be changed and modified in various ways without departing from the spirit and scope described in claims.

What is claimed is:

1. A probe pin comprising a first plunger configured to come in contact with a testing target contact point of a testing object and a second plunger configured to come in contact with a testing contact point of a testing circuit,
   wherein the first plunger or the second plunger has:
      a stem; and
      a contact portion extending from the stem such that a cross-sectional area decreases, and having first and second tips, which are configured to come in contact with the testing target contact point or the testing contact point, at a front end,
   wherein the first and second tips are formed in symmetric shapes at positions that are symmetric with a central axis of the stem therebetween,
   wherein the contact portion has a first to fourth inclined surfaces inclined from each of the first and second tips such that the first and second tips form apexes of square-base pyramids,
   wherein a pair of the first inclined surfaces is formed to face each other with the central axis therebetween to extend to a boundary line perpendicular to the central axis from the first and second tips,
   wherein a pair of the second inclined surfaces is formed in contact with a circular circumferential surface of the contact portion at an opposite side of the first inclined surfaces with the first and second tips therebetween, and
   wherein pairs of third and fourth inclined surfaces are each symmetrically formed at both sides with the first and second tips therebetween to come in contact with the first and second inclined surfaces, respectively.

2. The probe pin of claim 1, wherein the first to fourth inclined surfaces have the same inclined angle.

3. The probe pin of claim 1, wherein a distance between the first and second tips is greater than a radius of the stem and smaller than a diameter of the stem.

4. The probe pin of claim 1, wherein the boundary line of the first inclined surfaces is positioned between a lowermost point (P1) of the second inclined surface and lowermost points (P2) of the third and fourth inclined surface and is defined close to the lowermost points (P2).

* * * * *